(12) United States Patent
Tretter et al.

(10) Patent No.: US 6,320,713 B1
(45) Date of Patent: Nov. 20, 2001

(54) RATIO METHOD FOR MEASUREMENT OF MR READ HEAD RESISTANCE

(75) Inventors: Larry LeeRoy Tretter; James Ernest Malmberg, both of Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/395,147

(22) Filed: Sep. 14, 1999

(51) Int. Cl.⁷ .................................................. G11B 5/03
(52) U.S. Cl. ................... 360/66; 360/67; 360/46
(58) Field of Search ............... 360/67, 66, 313, 360/31, 61, 63; 324/212, 226

(56) References Cited

U.S. PATENT DOCUMENTS

| 4,716,306 | 12/1987 | Sato et al. . | |
| 5,412,518 | * 5/1995 | Christner et al. | 360/66 |
| 5,726,821 | 3/1998 | Cloke et al. . | |
| 5,774,291 | 6/1998 | Contreras et al. . | |
| 5,790,334 | * 8/1998 | Cunningham | 360/66 |
| 6,067,200 | * 5/2000 | Ohba et al. | 360/66 |
| 6,225,802 | * 5/2001 | Ramalho et al. | 360/67 |

FOREIGN PATENT DOCUMENTS 0 973 154 A1   1/2000   (EP) .

* cited by examiner

*Primary Examiner*—Alan T. Faber
(74) *Attorney, Agent, or Firm*—Douglas R. Millett; Esther E. Klein; Bracewell & Patterson, L.L.P.

(57) ABSTRACT

A reference current and resistance is used to determine a reference voltage. A variable current is then applied to the MR read head, and is adjusted to produce a voltage equal to that of the reference voltage. Then, the known current and voltage is used to determine the resistance of the MR read head.

22 Claims, 4 Drawing Sheets

RATIO METHOD FOR MEASUREMENT OF MR READ HEAD RESISTANCE

BACKGROUND OF THE INVENTION

1. Technical Field

The present invention generally relates to computer storage devices and in particular to magnetic read heads in computer storage devices. Still more particularly, the present invention relates to an improved method for determining MR read head resistance in computer storage devices.

2. Description of the Related Art

Manufacturers today go to great lengths to ensure that their products are of high quality, and that their operational characteristics are optimized. One group of products for which quality and reliability are of utmost importance are disk drives, which are widely utilized within computers and other devices for data storage. A disk drive, which is a type of magnetic recording device, can store vast amounts of data that can be quickly accessed.

One component of a disk drive is a magnetic transducer, referred to as a head, which is an electromagnetic device that is closely positioned to the disk to read and write data. High capacity disk drive units, which are common today, have multiple disks and multiple heads to read and write data. One type of high performance recording head is a magnetoresistive (MR) head. In order to optimize the MR head's operating point for optimum performance, it is important to first know the resistance across the MR head.

MR read heads are also used in other common storage devices, such as tape drives. The MR read head resistance is of importance for any MR read head application, including tape drives, disk drives, and others.

The measurement of the read head resistance is also important in order to ensure that the maximum power dissipation of the head is not exceeded. By knowing the resistance of the read head, more bias current can be allowed to flow through the head without exceeding the maximum power dissipation allowed in the head. More bias current means more head output, which can be very helpful in overcoming many system problems related to noise generated by the writing process.

Another advantage of measuring the head resistance to gather information relating to head wear over the life of the head while it is installed. This is possible because of the change in head resistance as a function of wear. Finally, Electrostatic Discharge (ESD) failures can be determined because a failed head will have a very high resistance.

One approach has been to assume a resistance value based upon statistical data, but manufacturing variations and the high sensitivity of the system to resistance variations can cause problems with this approach. Therefore, it is useful to measure the resistance of each head in a disk drive using a system such as controlling the biasing current applied to MR heads within a magnetic disk drive to provide optimized bias current for each head/disk/channel component combination.

At the time of manufacture, an optimized bias current for each head is ascertained and stored on the disk surface. During each subsequent power up operation the stored values are transferred to random access memory which is accessed during execution of each head switch command to apply a bias current in accordance with the optimized value to the active MR head.

One problem with this approach is that the MR resistance measurement must be accomplished at the subassembly level, before the unit is installed in the disk enclosure. For example, the resistance measurement must be completed at the MR head wafer level, the slider assembly level, or by inconvenient probing methods at the HeadStackAssembly (HSA) level (after the actuator has been assembled and just before it is merged into the disk enclosure). After the MR head, actuator and the like are merged together within the disk enclosure, the terminals of the MR head are not available for measurement without removing the unit from its enclosure, and it is impractical to extend the terminals beyond the disk enclosure because such extension can severely degrade the disk unit's file performance. Furthermore, MR resistance measurements made according to this method are time consuming and require special probes and fixtures to gain access to the MR resistance node.

For manufacturing purposes, it would be useful to protect the magnetoresistive recording heads against electrostatic discharge (ESD) with a shorting mechanism such as a solderball. In order to maximize ESD protection, the solderball should not be removed until the latest possible moment, which is just before the head is merged into the disk enclosure. However, using conventional techniques the MR resistance cannot be read until the short circuit has been removed, and measuring the resistance can be difficult once the disk drive has been installed into the disk enclosure.

SUMMARY OF THE INVENTION

It is therefore one object of the present invention to provide an improved computer storage device.

It is another object of the present invention to provide an improved magnetic read head system in computer storage devices.

It is yet another object of the present invention to provide an improved method for determining MR read head resistance in computer storage devices.

The foregoing objects are achieved as is now described. A known current and resistance is used to determine a reference voltage. A variable current is then applied to the MR read head, and is adjusted to produce a voltage equal to that of the reference voltage. Then, the known current and voltage is used to determine the resistance of the MR read head.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
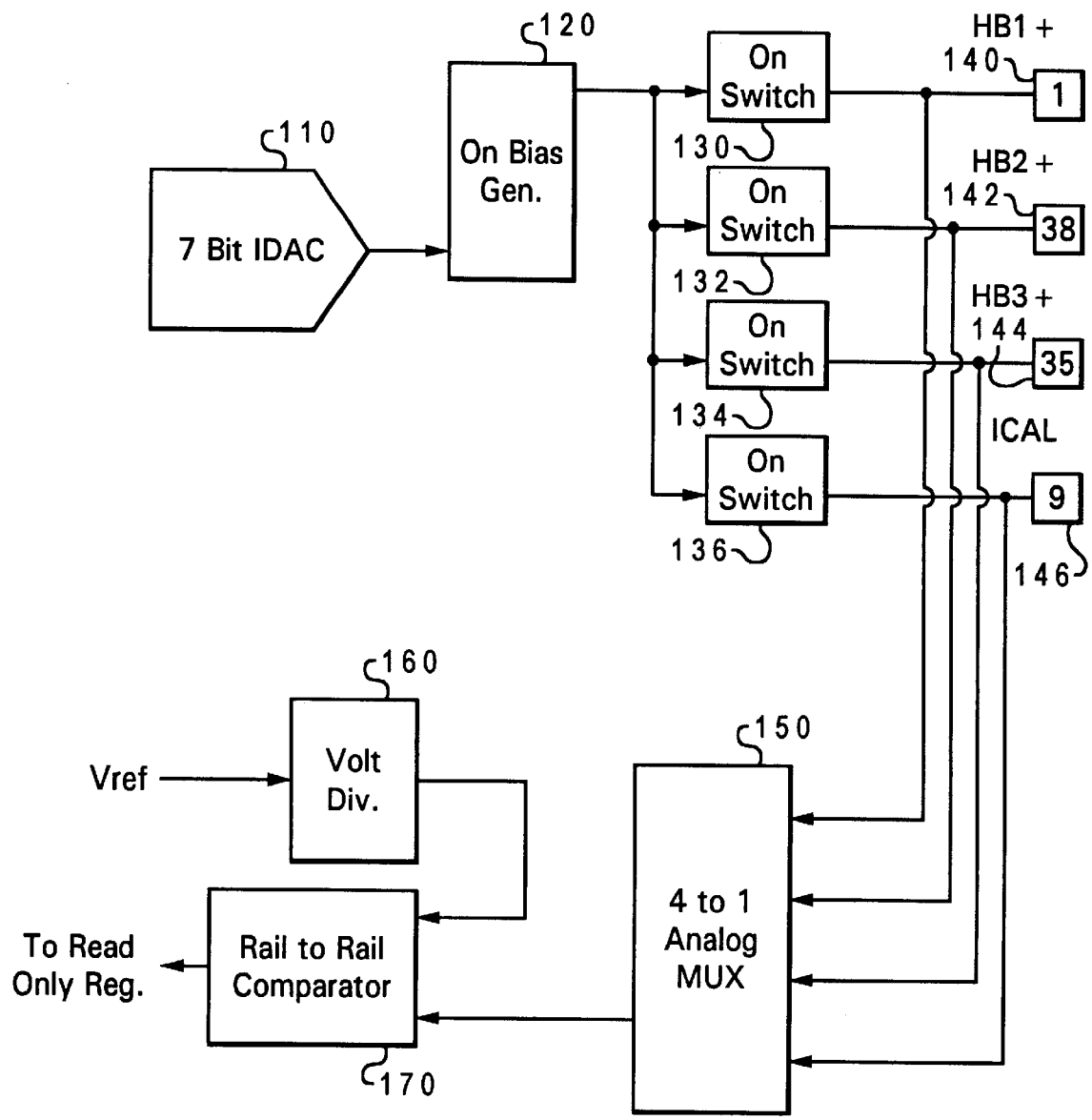
FIG. 1 depicts MR read head measurement circuit in accordance with a preferred embodiment of the present invention.

The preferred embodiment includes a method to allow the measurement of the MR read head resistance using a ratio technique. With reference now to FIG. 1, a block diagram of a MR read head measurement system according to the preferred embodiment is shown. In this embodiment, a 7 bit current DAC 110 is provided for setting the current going to an on bias generator 120, which biases either the, selected head via pins 140/142/144 or the calibration resistor pin 146. On switch blocks 130/132/134/136 are, preferably, large FET devices used to "steer" the biasing current to a selected head via pins 140/142/144 or the calibration resistor via pin 146. The elements described above will hereinafter be referenced collectively as the Analog Front-End module or AFE.

A 4 to 1 analog MUX 150 is used to connect one of the inputs of the comparator 170 to one of the MR read heads via pins 140/142/144 or the calibration resistor pin 146. The rail-to-rail comparator 170 is used to compare a reference voltage with the voltage generated at the MR read head bias pins 140/142/144 or with the ICAL calibration resistor pin 146.

A voltage divider 160 is used to generate, in this embodiment, 15 different reference voltages from an input reference voltage generated off chip.

Figure 2:
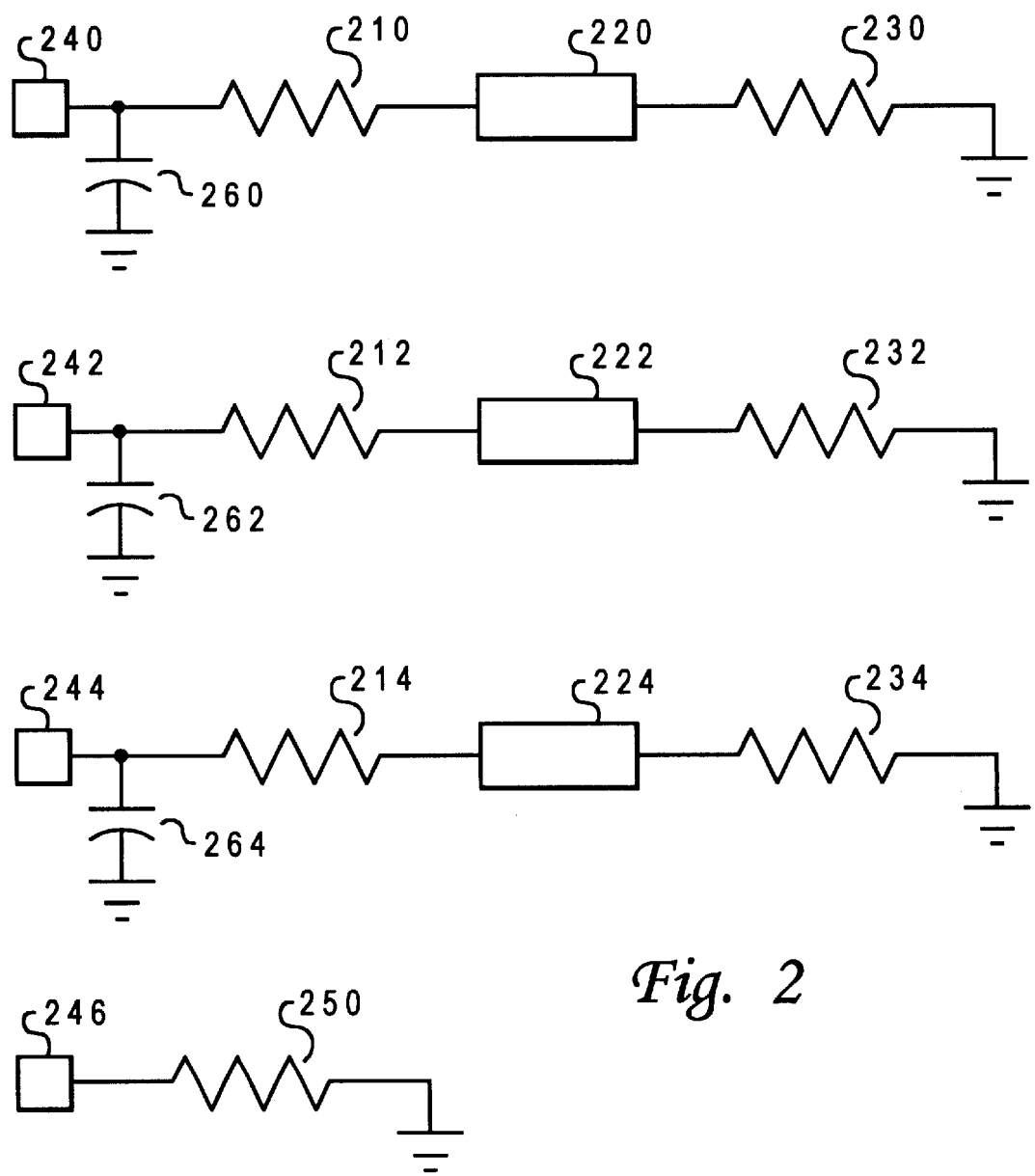
FIG. 2 is an MR read head circuit in accordance with a preferred embodiment of the invention.

In normal operation MR read heads are attached to pins 140/142/144. According to system requirements, the number of heads attached may vary. As shown in FIG. 2, the normal circuit configuration for the read head is a resistor 210/212/214 connected to the module pin 240/242/244 (corresponding to pins 140/142/144) in series with the MR read head 220/222/224 which in turn is in series with another resistor 230/232/234 connected to ground. In the preferred embodiment, a capacitor 260/262/264 is also connected from the MR read head bias pin 240/242/244 to ground. A resistor 250 is also connected from the ICAL pin 246 to ground.

The preferred method for measuring the MR read element resistance value is described below. This method used a ratio of the current required to give a fixed voltage value across a known resistance connected to the ICAL pin of the AFE (Analog Front End) module with respect to the current required to yield the same voltage across the MR read head and its two bias resistors.

A reference voltage value is applied to the minus input of the "rail-to-rail" comparator 170 using the voltage divider block 160. The positive input of the comparator 170 is connected, by way of the 4 to 1 analog MUX 150, to the ICAL pin 146 of the AFE module. The on bias current generator 120 is attached to the ICAL pin 146 using On Switch block 136. Now the 7 bit IDAC 110 is used to control the amount of "on bias" current that is flowing through the external calibration resistor 250. Each time the current is changed the code controlling the measurement process must delay an amount of time to allow the voltage developed across the ICAL pin to ground to settle, which in the preferred embodiment is a minimum of 1 millisecond, and then check to see if the bit of the read only register connected to the output of the comparator 170 is a one or a zero. If the bit is a one it means the voltage developed across the resistor connected to the ICAL pin 146 is larger than the reference voltage connected to the minus input of the comparator 170. If the bit is a zero it means the voltage developed across the resistor is less than the reference voltage. According to this method, these comparisons are used to determine the amount of current required to get the ICAL resistor voltage as close to the reference voltage value as possible. This IDAC value, hereinafter referred to as IICAL, is stored for later use.

The positive input of the comparator 170 is now connected, by way of the 4 to 1 analog MUX 150, to the HB1+, HB2+, or HB3+ pins 140/142/144 of the AFE module. The "on bias" current is attached to the same pin using on-switch 130/132/134. Now the 7 bit IDAC 110 is used to control the amount of "on bias" current that is flowing through the external bias resistors 210/212/214, 230/232/234 and MR read element 220/222/224 that are connected to HB1+, HB2+, or HB3+ pins 240/242/244 of AFE module. Each time the current is changed the code controlling the measurement process must delay an amount of time to allow the voltage developed across the external bias resistors and MR read element to settle, which in the preferred embodiment is a minimum of 1 millisecond, and then check to see if the bit of the read only register connected to the output of the comparator is a one or a zero. If the bit is a one it means the voltage developed across the external bias resistors and MR read element are larger than the reference voltage connected to the minus input of the comparator. If the bit is a zero it means the voltage developed is less than the reference voltage. The goal is to determine the amount of current required to get the voltage developed across the bias resistors 210/212/214, 230/232/234 and the MR read element 220/222/224 as close to the reference voltage as possible. Store the value of current that just changes the comparator output from zero to one. Call this value IMRHEAD.

If the value of ICAL resistor as defined as RICAL and the value of the resistance of the bias resistors and MR read element is defined as RBIASMR, then:

$$\frac{R_{ICAL} * IICAL}{R_{BIASMR} * IMRHEAD} = \frac{V_{REF}}{V_{REF}} \text{ or}$$

$$\frac{R_{ICAL} * IICAL}{R_{BIASMR} * IMRHEAD} = 1$$

The above relation is true because for each case the value of current was selected to yield the same voltage value. All the values above are known, except for RBIASMR, which represents the sum of the value of the resistance of the bias resistors and MR read element, so the equation can be solved for RBIASMR:

$$R_{BIASMR} = \frac{R_{ICAL} * IICAL}{IMRHEAD}$$

It should be noted that the above equation is a ratio of the generated "on bias" current for both conditions. This means that any systematic errors in the generation of the current are eliminated from the calculation.

The MR read head resistance can now be calculated because the value of the two resistors connected in series with the head is known. If RMRHEAD is the resistance of the MR read element and RBIAS is the value of the bias resistors, then the following equation gives the value of RMRHEAD:

$$R_{MRHEAD} = R_{BIASMR} - 2 * R_{BIAS} \text{ or}$$

$$R_{MRHEAD} = \frac{R_{ICAL} * IICAL}{IMRHEAD} - 2 * R_{BIAS}$$

Once calculated, the MR read head resistance can be used to determine the maximum bias current which can be allowed to flow through the head. Also, knowing the head resistance allows one to keep the current density a constant value as the head resistance increases over the life of the head. Further, the head resistance can be used to determine the life of the head, and to optimize the operation of the storage device. The preferred embodiment, unlike in prior art techniques, uses a direct current approach to the problem and adds little additional circuitry to the chip.

Figure 3:
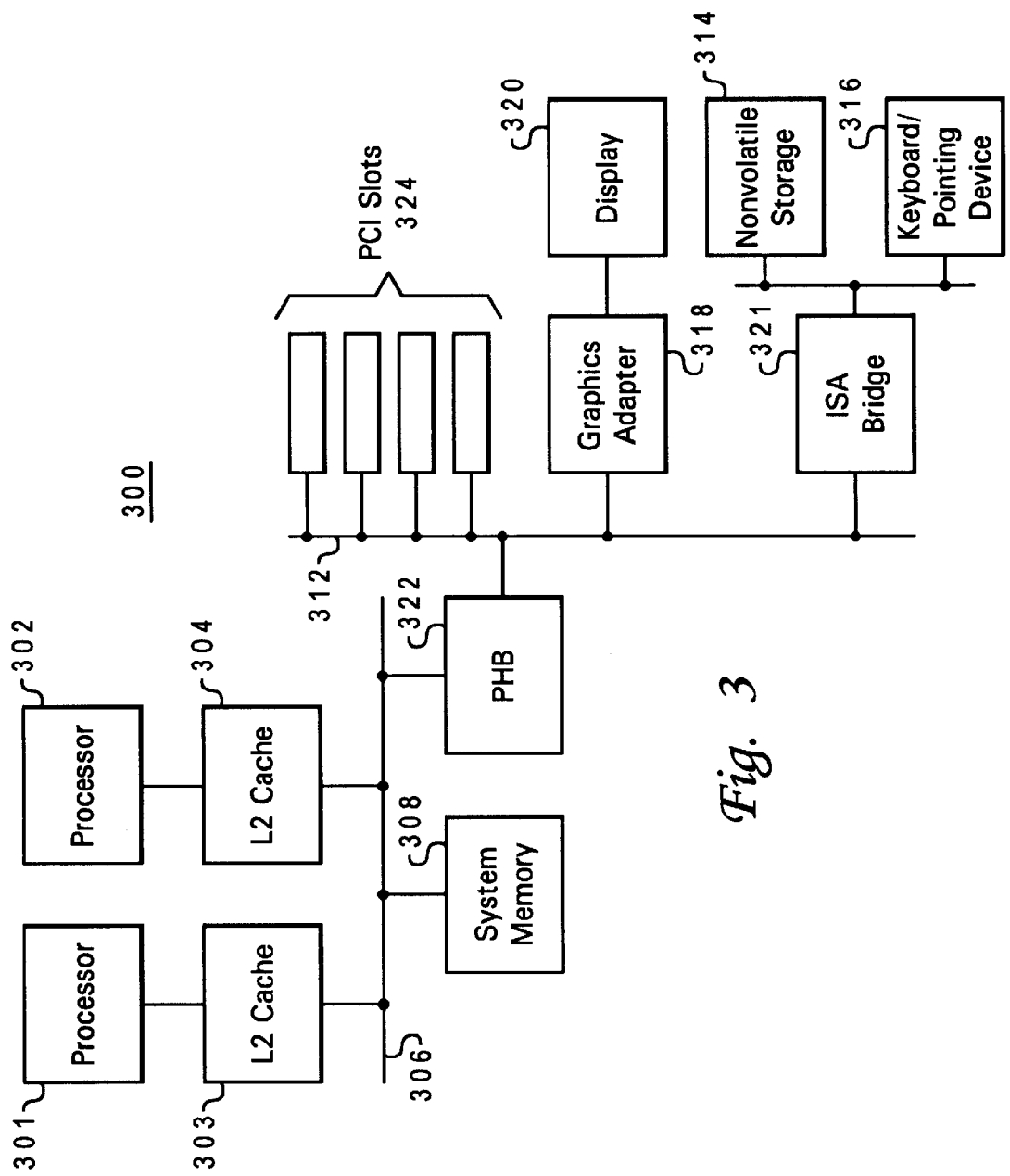
FIG. 3 depicts a block diagram of a data processing system in which a preferred embodiment of the present invention may be implemented.

With reference now to FIG. 3, a block diagram of a data processing system in which a preferred embodiment of the present invention may be implemented is depicted. Data processing system 300 may be, for example, one of the computers available from International Business Machines Corporation of Armonk, New York. Data processing system 300 includes processors 301 and 302, which in the exemplary embodiment are each connected to level two (L2) caches 303 and 304, respectively, which are connected in turn to a system bus 306.

Also connected to system bus 306 is system memory 308 and Primary Host Bridge (PHB) 322. PHB 322 couples I/O bus 312 to system bus 306, relaying and/or transforming data transactions from one bus to the other. In the exemplary embodiment, data processing system 300 includes graphics adapter 318 connected to I/O bus 312, receiving user interface information for display 320. Peripheral devices such as nonvolatile storage 314, will include a hard disk drive or tape drive employing one or more magnetoresistive read heads, and keyboard/pointing device 316, which may include a conventional mouse, a trackball, or the like, are connected via an Industry Standard Architecture (ISA) bridge 321 to I/O bus 312. PHB 322 is also connected to PCI slots 324 via I/O bus 312.

The exemplary embodiment shown in FIG. 3 is provided solely for the purposes of explaining the invention and those skilled in the art will recognize that numerous variations are possible, both in form and function. For instance, data processing system 300 might also include a compact disk read-only memory (CD-ROM) or digital video disk (DVD) drive, a sound card and audio speakers, and numerous other optional components. All such variations are believed to be within the spirit and scope of the present invention. Data processing system 300 and the exemplary figures below are provided solely as examples for the purposes of explanation and are not intended to imply architectural limitations. In fact, this method and system can be easily adapted for use on any programmable computer system, or network of systems, which utilize storage devices with MR read heads.

Figure 4:
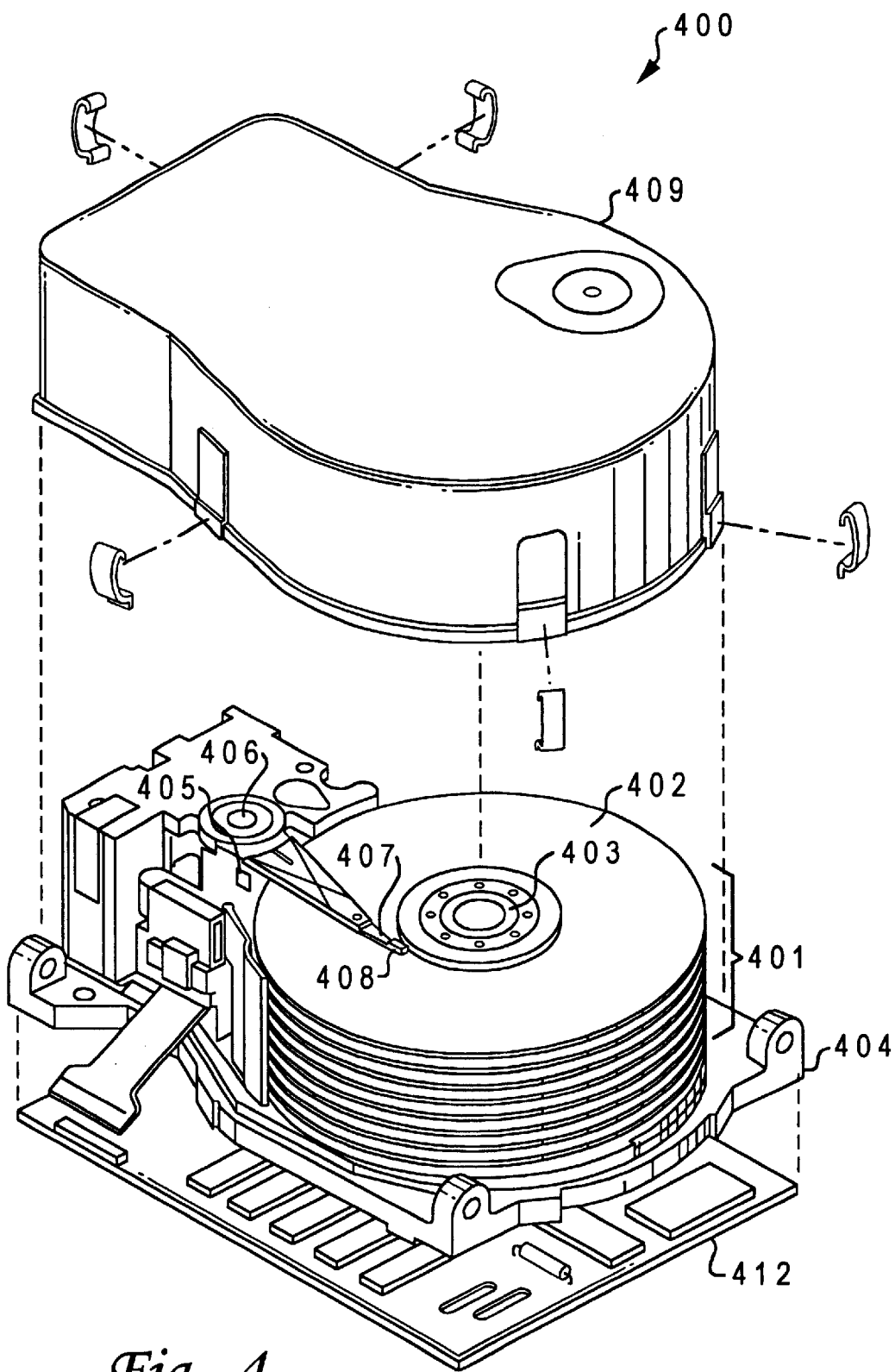
FIG. 4 depicts an exemplary disk storage device in accordance with a preferred embodiment of the invention.

Referring now to FIG. 4, a magnetic disk drive direct-access storage device (DASD) 400 according to a preferred embodiment of the present invention includes: a plurality of disks 401 with magnetic recording surfaces 402; a hub or spindle 403; a base 404; a bias supply source control circuit 405; a shaft 406; a plurality of head suspension assemblies 407; a plurality of MR read heads 408; a cover 409; and a circuit card 412. Bias supply source control circuit 405 is any circuit or apparatus that is capable of altering and setting the amount of bias supplied to MR read heads 408 based on the resistance of MR read heads 408. Regardless of where bias supply source control circuit 405 is located, bias supply source control circuit 405 allows a determination of MR read head bias supply for each MR read head 408 based on the resistance of each individual MR read head 408. The resistance of each MR read head 408 is determined according to the preferred method described above.

The amount of bias to be supplied to MR read heads 408 is determined by bias supply source control circuit 405. When the resistance ratio is below some desired ideal ratio, then the amount of bias supplied to MR read heads 408 is increased in order to increase the sensitivity of MR heads 408, thereby increasing the signal-to-noise ratio and improving the performance of DASD 400.

While the invention has been particularly shown and described with reference to a preferred embodiment, it will be understood by those skilled in the art that various changes in form and detail may be made therein without departing from the spirit and scope of the invention.

What is claimed is:

1. A method for determining the resistance of a magnetoresistive head, comprising the steps of:

passing a reference current through a reference load to generate a reference voltage;

storing the reference voltage;

passing a adjustable current through a magnetoresistive head to produce a head voltage;

varying the adjustable current until the head voltage is substantially equal to the reference voltage; and determining the resistance of the magnetoresistive head from the adjustable current and the head voltage.

2. The method of claim 1, wherein the magnetoresistive head is configured to read data from a magnetic tape.

3. The method of claim 1, wherein the magnetoresistive head is configured to read data from a magnetic disk.

4. The method of claim 1, wherein the reference voltage is stored in a computer memory.

5. The method of claim 1, further comprising, after the varying step, storing the value of the adjustable current.

6. A system for measuring the resistance of a magnetoresistive head, comprising:

circuitry for generating an adjustable bias current;

a magnetoresistive head connected to selectively receive the bias current, the bias current producing a head voltage across the magnetoresistive head;

a reference load connected to selectively receive the bias current, the bias current producing a reference voltage across the reference load; and circuitry for measuring the reference voltage and the head voltage, wherein the reference voltage is used determine the resistance of the magnetoresistive head, based on the bias current and the head voltage.

7. The system of claim 6, wherein the circuitry for generating an adjustable bias current comprises a digital-to-analog converter.

8. The system of claim 6, further comprising a switch connected between the magnetoresistive head and the circuitry for generating an adjustable bias current.

9. The system of claim 6, further comprising circuitry to store the reference voltage.

10. The system of claim 6, further comprising a comparator connected to receive the reference voltage and the head voltage.

11. The system of claim 6, further comprising at least one additional magnetoresistive read head.

12. The system of claim 6, further comprising a multiplexor circuit connected to receive the head voltage and the reference voltage.

13. The system of claim 6, further comprising a voltage divider circuit to reproduce the reference voltage.

14. A magnetic storage/read system comprising:

a recording medium for magnetically storing a signal;

a magnetoresistive element connected to read from and write to the recording medium; and a circuit for determining the resistance across the magnetoresistive element, having a circuitry for generating an adjustable bias current which is selectively passed through the magnetoresistive element to produce a head voltage across the magnetoresistive element;

a reference load connected to selectively receive the bias current, the bias current producing a reference voltage across the reference load; and circuitry for measuring the reference voltage and the head voltage, wherein the reference voltage is used determine the resistance of the magnetoresistive element, based on the bias current and the head voltage.

15. The system of claim 14, wherein the circuitry for generating an adjustable bias current comprises a digital-to-analog converter.

16. The system of claim 14, further comprising a switch connected between the magnetoresistive head and the circuitry for generating an adjustable bias current.

17. The system of claim 14, further comprising circuitry to store the reference voltage.

18. The system of claim 14, further comprising a comparator connected to receive the reference voltage and the head voltage.

19. The system of claim 14, further comprising at least one additional magnetoresistive read head.

20. The system of claim 14, further comprising a multiplexor circuit connected to receive the head voltage and the reference voltage.

21. The system of claim 14, further comprising a voltage divider circuit to reproduce the reference voltage.

22. A disk drive unit comprising:

a controller unit;

a spindle drive controller coupled to the controller unit;

a plurality of stacked magnetic disks rotatably mounted on a spindle coupled to a spindle motor, said spindle motor electrically coupled to the spindle drive controller;

at least one magnetoresistive (MR) head electrically coupled to the controller unit;

an actuator drive controller coupled to the controller unit;

an actuator shaft rotatably coupled to an actuator motor, said actuator motor coupled to the actuator drive controller;

an actuator assembly coupled to the actuator shaft, comprising a comb unit having a plurality of actuator arms and a hub assembly coupled to the actuator shaft, and a plurality of head suspension assemblies each coupled to one of said plurality of actuator arms, each head suspension assembly comprising an MR head, and an arm electronics unit situated in close proximity to said actuator assembly, comprising a control unit for supplying a measurement enable signal; and a measurement circuit implemented within said arm electronics unit, comprising a circuitry for generating an adjustable bias current which is selectively passed through the magnetoresistive element to produce a head voltage across the MR head;

a reference load connected to selectively receive the bias current, the bias current producing a reference voltage across the reference load; and circuitry for measuring the reference voltage and the head voltage, wherein the reference voltage is used determine the resistance of the MR head, based on the bias current and the head voltage.

* * * * *